United States Patent
Zhao et al.

(10) Patent No.: US 12,232,276 B2
(45) Date of Patent: Feb. 18, 2025

(54) SPLICING DISPLAY SCREEN

(71) Applicant: TCL CHINA STAR OPTOELECTRONICS TECHNOLOGY CO., LTD., Guangdong (CN)

(72) Inventors: Guanqiao Zhao, Guangdong (CN); Lijian Xiao, Guangdong (CN); Zhongyin Lu, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/756,523

(22) PCT Filed: May 18, 2022

(86) PCT No.: PCT/CN2022/093585
§ 371 (c)(1),
(2) Date: May 26, 2022

(87) PCT Pub. No.: WO2023/201818
PCT Pub. Date: Oct. 26, 2023

(65) Prior Publication Data
US 2024/0224438 A1  Jul. 4, 2024

(30) Foreign Application Priority Data
Apr. 20, 2022 (CN) .......................... 202210419963.X

(51) Int. Cl.
*H05K 5/00* (2006.01)
*G09F 9/302* (2006.01)

(52) U.S. Cl.
CPC ......... *H05K 5/0021* (2013.01); *G09F 9/3023* (2013.01)

(58) Field of Classification Search
CPC ... H05K 5/0021; H05K 5/0017; H05K 5/0217
(Continued)

(56) References Cited

U.S. PATENT DOCUMENTS

| | | | | |
|---|---|---|---|---|
| 2014/0091686 A1* | 4/2014 | Pegg | ................. | H04M 1/0252 312/222 |
| 2015/0277491 A1* | 10/2015 | Browning | ............ | G06F 1/1632 248/346.03 |
| 2022/0165184 A1* | 5/2022 | Zhang | ................. | F16M 13/022 |

FOREIGN PATENT DOCUMENTS

| | | | |
|---|---|---|---|
| CN | 104392670 A | | 3/2015 |
| CN | 104900150 A | | 9/2015 |
| | (Continued) | | |

OTHER PUBLICATIONS

Chinese Office Action issued in corresponding Chinese Patent Application No. 202210419963.X dated Jun. 24, 2023, pp. 1-7.
(Continued)

*Primary Examiner* — Hung S. Bui

(57) ABSTRACT

A splicing display screen is provided by the present application. The splicing display screen includes at least one first display module, at least one second display module, and a positioning assembly. The first display module includes a first frame. The first frame is defined with at least one first locking hole. The second display module includes a second frame. The second frame is defined with at least one first positioning hole. One of the first positioning holes corresponds to one of the first locking holes. The positioning assembly is disposed in the first locking hole. The positioning assembly includes a positioning member and an elastic member. A part of the positioning member is clamped into the first positioning hole.

18 Claims, 5 Drawing Sheets

(58) Field of Classification Search
USPC .................. 361/732, 728, 759, 801, 803
See application file for complete search history.

(56) References Cited

FOREIGN PATENT DOCUMENTS

| | | |
|---|---|---|
| CN | 208831412 U | 5/2019 |
| CN | 111405792 A | 7/2020 |
| CN | 211787994 U | 10/2020 |
| CN | 213519029 U | 6/2021 |
| CN | 214587724 U | 11/2021 |
| CN | 214847508 U | 11/2021 |
| CN | 215118139 U | 12/2021 |
| CN | 114373396 A | 4/2022 |
| WO | 2021218225 A1 | 11/2021 |

OTHER PUBLICATIONS

International Search Report in International application No. PCT/CN2022/093585, mailed on Dec. 15, 2022.
Written Opinion of the International Search Authority in International application No. PCT/CN2022/093585, mailed on Dec. 15, 2022.
Chinese Office Action issued in corresponding Chinese Patent Application No. 202210419963.X dated Nov. 23, 2022, pp. 1-7.

\* cited by examiner

SPLICING DISPLAY SCREEN

BACKGROUND OF INVENTION

Field of Invention

The present application relates to the field of display technology, in particular to a splicing display screen.

Description of Prior Art

With a continuous development of display technology, applications of displays are becoming increasingly extensive, not only used for televisions, monitors, industrial displays, and medical displays, but also applied more and more in public display occasions. In a case of public display applications, it is generally necessary for the displays to have a larger display area to meet requirements of people watching from a distance and displaying a large amount of information.

A splicing application of a display panel is often multi-screen linkage, which requires a large number of display modules. Existing modules do not have a positioning device during splicing and assembly, and after the modules are spliced, a gap between the modules is large and splicing is not firm, and a phenomenon of uneven front and rear dislocation is prone to occur at a splicing line. How to reduce a splicing gap between the modules and solve the phenomenon that the splicing between the modules is not firm and the phenomenon of unevenness of the front and rear dislocation have become urgent problems to be solved.

Therefore, it is necessary to propose a new technical solution to solve above-mentioned technical problems.

SUMMARY OF INVENTION

Embodiments of a present application provide a splicing display screen, which is used to improve a problem that uneven front and rear dislocation is prone to occur at a splicing line.

The present application provides a splicing display screen, including:
- at least one first display module, the first display module including a first frame, and the first frame defined with at least one first locking hole;
- at least one second display module, the second display module located on a side of the first display module, the second display module including a second frame, the second frame defined with at least one first positioning hole, one of the first positioning holes corresponding to one of the first locking holes;
- a positioning assembly, the positioning assembly disposed in the first locking hole, the positioning assembly including a positioning member and an elastic member, the positioning member being in contact with or connected to the elastic member, and the positioning member disposed on a side of the elastic member close to the first positioning hole, and a part of the positioning member clamped into the first positioning hole.

Optionally, in the embodiments of the present application, the positioning assembly further includes a fixing member, the fixing member is defined with an accommodating cavity, the elastic member is disposed in the accommodating cavity, and the positioning member is disposed on a side of the elastic member away from a bottom of the accommodating cavity.

Optionally, in the embodiments of the present application, the positioning assembly further includes a limiting member, the limiting member is disposed on a side of the fixing member away from the bottom of the accommodating cavity, and the limiting member is defined with an opening, the opening communicates with the accommodating cavity, and a width of the accommodating cavity is greater than a width of the opening.

Optionally, in the embodiments of the present application, the first locking hole includes a first contact hole and a second contact hole communicatingly disposed, and a hole wall of the second contact hole is located on an outer side of the first contact hole, the fixing member is disposed in the first contact hole, and the limiting member is disposed in the second contact hole.

Optionally, in the embodiments of the present application, the fixing member is provided with external threads, the first contact hole is provided with internal threads corresponding to the external threads, and the fixing member is screw connected with the first contact hole.

Optionally, in the embodiments of the present application, the first positioning hole is an arc-shaped hole, the positioning member is in a shape of a sphere, and a curvature radius of the first positioning hole and a radius of the positioning member are same.

Optionally, in the embodiments of the present application, a diameter of the positioning member is less than the width of the accommodating cavity, and the diameter of the positioning member is equal to the width of the opening.

Optionally, in the embodiments of the present application, the opening includes an elongated opening or a circular opening.

Optionally, in the embodiments of the present application, the positioning member is a steel ball.

Optionally, in the embodiments of the present application, the positioning member includes a first part, a second part, and a third part, and the first part and the third part are connected by the second part, a width of the second part is equal to a width of a cavity opening of the accommodating cavity, and a shape of the third part is a partial arc surface of a sphere.

Optionally, in the embodiments of the present application, convex points are provided in the first positioning hole, after the positioning member is clamped into the first positioning hole, the convex points block an outward movement of the second part.

Optionally, in the embodiments of the present application, the second part includes a body portion and a plurality of protrusions surrounding an outer wall of the body portion.

Optionally, in the embodiments of the present application, the first display module further includes a third frame, the third frame is located on an opposite side of the first frame, and the third frame is defined with at least one second positioning hole:
  the second display module further includes a fourth frame, the fourth frame is located on an opposite side of the second frame, the fourth frame is defined with at least one second locking hole, one of the second positioning holes corresponds to one of the second locking holes, the positioning assembly is disposed in the second locking hole, the positioning member is disposed on a side of the elastic member close to the second positioning hole, and a part of the positioning member is clamped into the second positioning hole.

Optionally, in the embodiments of the present application, the first display module includes a first box body and a first light-emitting unit, the first box body includes the first frame, the third frame, and a first support plate, the first box body is defined with a first accommodating slot, and the first light-emitting unit is disposed in the first accommodating slot:

the second display module includes a second box body and a second light-emitting unit, the second box body includes the second frame, the fourth frame, and a second support plate, the second box is defined with a second accommodating slot, and the second light-emitting unit is disposed in the second accommodating slot.

Optionally, in the embodiments of the present application, a surface of the first support plate away from the first light-emitting unit is provided with a first anti-collision protrusion: a surface of the second support plate away from the second light-emitting unit is provided with a second anti-collision protrusion.

Optionally, in the embodiments of the present application, the first frame is further defined with at least one second positioning hole, and the second positioning hole is defined on a side of the first locking hole:

the second frame is further defined with at least one second locking hole, the second locking hole is defined on a side of the first positioning hole, and one of the second positioning holes corresponds to one of the second locking holes, the positioning assembly is also disposed in the second locking hole, the positioning member is disposed on a side of the elastic member close to the second positioning hole, and a part of the positioning member is clamped into the second positioning hole.

Optionally, in the embodiments of the present application, the first frame is further provided with a bump, and the first locking hole is disposed at a side of the bump close to a display surface of the first display module:

the second frame is further defined with a groove, the first positioning hole is disposed at a side of the groove close to a display surface of the second display module, and the first positioning hole is communicated with the groove, the bump is disposed in the groove.

Optionally, in the embodiments of the present application, the first display module and the second display module include any one of organic light-emitting diode display module, micro light-emitting diode display module, millimeter light-emitting diode display module, or liquid crystal display module.

Optionally, in the embodiments of the present application, the elastic member includes one of a spring or a compression spring.

Optionally, in the embodiments of the present application, the first display module and the second display module have a same structure.

Advantageous Effects

Embodiments of the present application provide a splicing display screen, the splicing display screen includes at least one first display module, at least one second display module, and the positioning assembly. The first display module includes the first frame. The first frame is defined with at least one first locking hole. The second display module is located on the side of the first display module. The second display module includes the second frame. The second frame is defined with at least one first positioning hole. One of the first positioning holes corresponding to one of the first locking holes. The positioning assembly is disposed in the first locking hole. The positioning assembly includes the positioning member and the elastic member. The positioning member being in contact with or connected to the elastic member. The positioning member is disposed on the side of the elastic member close to the first positioning hole. A part of the positioning member is clamped into the first positioning hole. In the splicing display screen provided by the embodiments of the present application, when the first display module and the second display module are spliced, under an elastic effect of the elastic member, a part of the positioning member is clamped into the first positioning hole, so as to complete an alignment of the first display module and the second display module. The splicing display screen provided by the embodiments of the present application can be precisely aligned, preventing phenomena of a large gap between adjacent display modules after splicing of display modules, weak splicing, and uneven front and rear dislocation being prone to occur at a splicing line.

BRIEF DESCRIPTION OF DRAWINGS

In order to more clearly illustrate the embodiments or the technical solutions of the existing art, the drawings illustrating the embodiments or the existing art will be briefly described below. The drawings in the following description merely illustrate some embodiments of the present application. Other drawings may also be obtained by those skilled in the art according to these figures without paying creative work.

DETAILED DESCRIPTION OF PREFERRED EMBODIMENTS

Figure 1:
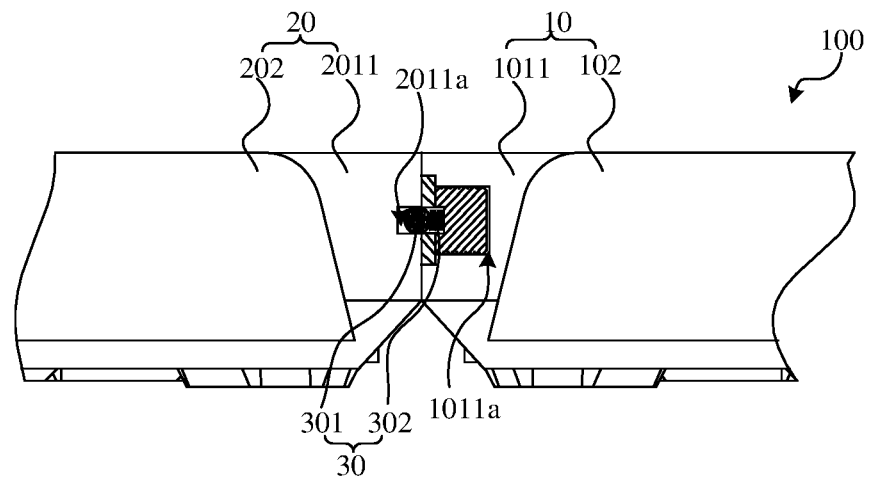
FIG. 1 is a first structural schematic diagram of a splicing display screen provided by an embodiment of the present application.

In order to make the objective, technical solution and advantages of the present application clearer, the present application will be further described in detail below with reference to the accompanying drawings. Referring to the figures in the accompanying drawings. The components with the same reference numbers represent the same or similar components. The following description is based on the illustrated specific embodiments of the present disclosure, and should not be construed to limit the other specific embodiments which are not described in detail herein. The word "embodiment" configured in this specification means an example, example, or illustration.

In the description of the present disclosure, it is to be understood that the azimuth or positional relationships indicated by the terms "center", "longitudinal", "transverse", "length", "width", "thickness", "upper", "lower", "front", "back", "left", "right", "vertical", "horizontal", "top", "bottom", "inside", "outside", "clockwise", "counter-clockwise", etc., are based on the azimuth or positional relationship shown in the drawings, merely for the purpose of assisting and simplify the description, rather than indicating or implying that the indicated device or element must have a specific orientation, and be constructed and operated in a particular orientation. Therefore, these terms cannot be construed as limiting the present disclosure. In addition, the terms "first" and "second" are only configured for descriptive purposes, and cannot be understood as indicating or implying relative importance or implicitly indicating the number of indicated technical features. Therefore, the features defined with "first" and "second" may explicitly or implicitly include one or more of the features. In the description of the present application, "a plurality of" means two or more than two, unless otherwise specifically defined.

Embodiments of a present application provide a splicing display screen. Each of them will be described in detail below. It should be noted that the description order of the following embodiments is not intended to limit the preferred order of the embodiments.

Embodiments of the present application provide a splicing display screen, the splicing display screen includes at least one first display module, at least one second display module, and a positioning assembly. The first display module includes a first frame. The first frame is defined with at least one first locking hole. The second display module is located on a side of the first display module. The second display module includes a second frame. The second frame is defined with at least one first positioning hole. One of the first positioning holes corresponds to one of the first locking holes. The positioning assembly is disposed in the first locking hole. The positioning assembly includes a positioning member and an elastic member. The positioning member is in contact with or connected to the elastic member. The positioning member is disposed on a side of the elastic member close to the first positioning hole. A part of the positioning member is clamped into the first positioning hole. In the splicing display screen provided by the embodiments of the present application, when the first display module and the second display module are spliced, under an elastic effect of the elastic member, a part of the positioning member is clamped into the first positioning hole, so as to complete an alignment of the first display module and the second display module. The splicing display screen provided by the embodiments of the present application can be precisely aligned, preventing phenomena of a large gap between adjacent display modules after splicing of display modules, weak splicing, and uneven front and rear dislocation being prone to occur at a splicing line.

The splicing display screen provided by the present application will be described in detail below through specific embodiments.

Figure 2:
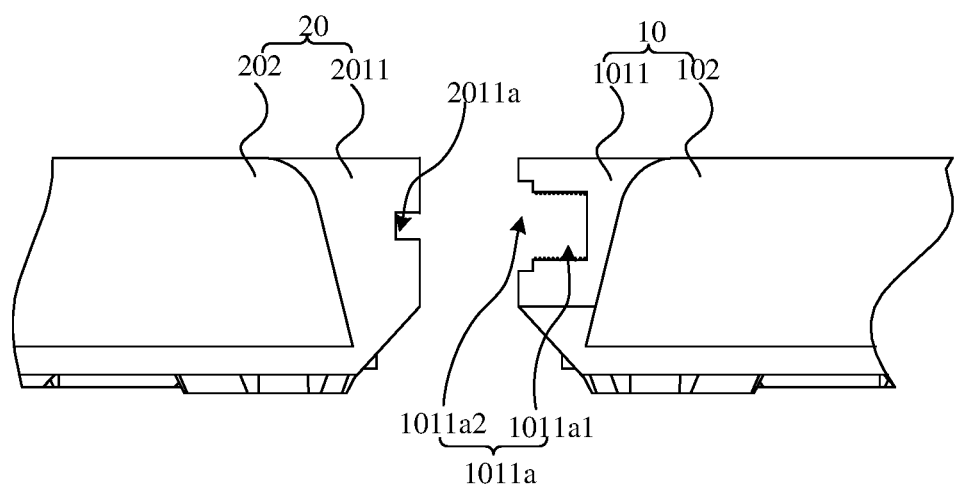
FIG. 2 is a first structural schematic diagram of a first display module and a second display module provided by an embodiment of the present application.
Figure 3:
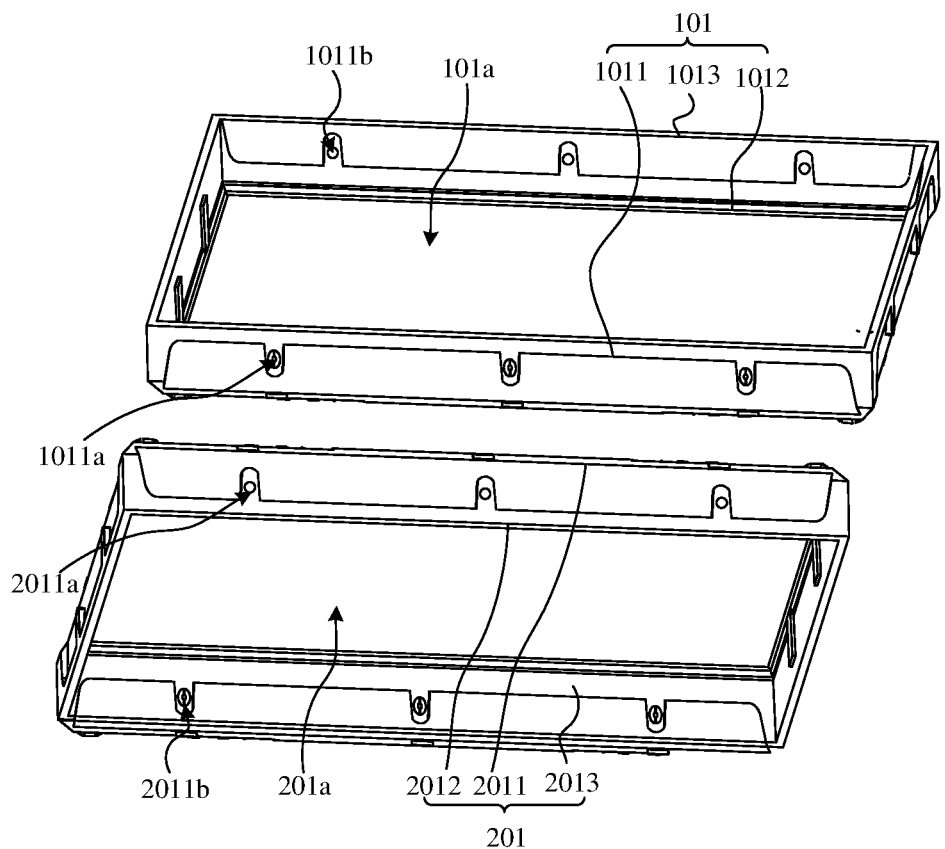
FIG. 3 is a structural schematic diagram of a first box body and a second box body provided by an embodiment of the present application.

Please refer to FIG. 1, FIG. 2 and FIG. 3, FIG. 1 is a first structural schematic diagram of a splicing display screen provided by an embodiment of the present application. FIG. 2 is a first structural schematic diagram of a first display module and a second display module provided by an embodiment of the present application. FIG. 3 is a structural schematic diagram of a first box body and a second box body provided by an embodiment of the present application. The embodiment of the present application provides a splicing display screen 100. The splicing display screen 100 includes at least one first display module 10, at least one second display module 20, and a positioning assembly 30. The first display module 10 includes a first box body 101 and a first light-emitting unit 102. The first box body 101 includes a first frame 1011. The first frame 1011 is defined with at least one first locking hole 1011a. The second display module 20 is located on a side of the first display module 10. The second display module 20 includes a second box body 201 and a second light-emitting unit 202. The second box body 201 includes a second frame 2011. The second frame 2011 is defined with at least one first positioning hole 2011a. One of the first positioning holes 2011a corresponds to one of the first locking holes 1011a. The positioning assembly 30 is disposed in the first locking hole 1011a. The positioning assembly 30 includes a positioning member 301 and an elastic member 302. The positioning member 301 is in contact with or connected to the elastic member 302. The positioning member 301 is disposed on a side of the elastic member 302 close to the first positioning hole 2011a. A part of the positioning member 301 is clamped into the first positioning hole 2011a. In the splicing display screen 100 provided by the embodiment of the present application, when the first display module 10 and the second display module 20 are spliced, under an elastic effect of the elastic member 302, a part of the positioning member 301 is clamped into the first positioning hole 2011a, so as to complete an alignment and splicing of the first display module 10 and the second display module 20. The splicing display screen 100 provided by the embodiment of the present application can be precisely aligned, preventing phenomena of a large gap between adjacent display modules after splicing of display modules, weak splicing, and uneven front and rear dislocation being prone to occur at a splicing line. In addition, since the elastic member 302 can be compressed or stretched under an effect of external force, when the first frame 1011 and the second frame 2011 are correspondingly provided with a plurality of first locking holes 1011a and first positioning holes 2011a, even if alignments of a part of the positioning assemblies 30 are deviated, there will not be phenomena of weak splicing and uneven front and rear dislocation being prone to occur at the splicing line.

It should be noted that in this embodiment of the present application, the first display module 10 and the second display module 20 may be organic light-emitting diode (OLED) display module, micro light-emitting diode (micro LED) display module, millimeter light-emitting diode (mini LED) display module, liquid crystal display (LCD) module, etc.

The first box body 101 further includes a first support plate 1012. The first box body 101 is defined with a first accommodating slot 101a. The first light-emitting unit 102 is disposed in the first accommodating slot 101a. The second box body 201 further includes a second support plate 2012. The second box body 201 is defined with a second accommodating slot 201a. The second light-emitting unit 202 is disposed in the second accommodating slot 201a. In the embodiment of the present application, the first light-emitting unit 102 and the second light-emitting unit 202 are respectively placed by the first box body 101 and the second box body 201, and the first locking hole 1011a and a first positioning hole 2011a are respectively defined on borders of the first box body 101 and the second box body 201, and the positioning and fixing of the first display module 10 and the second display module 20 are completed by using the positioning assembly 30. In the present application, the positioning member 301 and the first positioning hole 2011*a* are used to limit a position between adjacent box bodies, and have high installation accuracy and fast installation efficiency, thereby improving the installation accuracy of the splicing display screen 100.

In some embodiments, materials of the first box body 101 and the second box body 201 are steel plates.

In some embodiments, lower side plates of the first support plate 1012 and the second support plate 2012 may be provided with anti-collision protrusions (not shown in the figures). That is, a surface of the first support plate 1012 away from the first display module 10 is provided with a first anti-collision protrusion. A surface of the second support plate 2012 away from the second display module 20 is provided with a second anti-collision protrusion. By setting the anti-collision protrusion, when the box body is placed on a ground, the anti-collision protrusion is in contact with the ground, which can effectively prevent bumping and scratching of a front maintenance box body.

In some embodiments, the first frame 1011 is further defined with at least one second positioning hole 1011*b*. The second positioning hole 1011*b* is disposed on a side of the first locking hole 1011*a*. The second frame 2011 is further defined with at least one second locking hole 2011*b*. The second locking hole 2011*b* is disposed on a side of the first positioning hole 2011*a*. And one of the second positioning holes 1011*b* corresponds to one of the second locking holes 2011*b*. The positioning assembly 30 is also disposed in the second locking hole 2011*b*. The positioning member 301 is disposed on a side of the elastic member 302 close to the second positioning hole 1011*b*. A part of the positioning member 301 is clamped into the second positioning hole 1011*b*. In the embodiment of the present application, since the first frame 1011 is defined with the second positioning hole 1011*b*, and the second frame 2011 is defined with the second locking hole 2011*b*, so as to realize a bidirectional splicing of the first display module 10 and the second display module 20, the splicing of the first display module 10 and the second display module 20 is made more firm, further increasing a stability of the splicing display screen 100.

In some embodiments, the first box body 101 further includes a third frame 1013. The third frame 1013 is located on an opposite side of the first frame 1011. The third frame 1013 is defined with at least one second positioning hole 1011*b*. The second box body 201 further includes a fourth frame 2013. The fourth frame 2013 is located on an opposite side of the second frame 2011. The fourth frame 2013 is defined with at least one second locking hole 2011*b*. One of the second positioning holes 1011*b* corresponds to one of the second locking holes 2011*b*. The positioning assembly 30 is disposed in the second locking hole 2011*b*. The positioning member 301 is clamped on the side of the elastic member 302 close to the second positioning hole 1011*b*. A part of the positioning member 301 is clamped into the second positioning hole 1011*b*. In this embodiment of the present application, the second positioning hole 1011*b* is defined on the opposite side of the first locking hole 1011*a*, and the second locking hole 2011*b* is defined on the opposite side of the first positioning hole 2011*a*, so as to realize accurate positioning and quick splicing of multiple pieces of the first display module 10 and multiple pieces of the second display module 20, thereby meeting a market demand for large-screen display devices.

It should be understood that in this embodiment of the present application, the first display module 10 and the second display module 20 may be display modules with a same structure. In the present application, for a convenience of description, the display modules with the same structure are divided artificially are the first display module 10 and the second display module 20.

Figure 4:
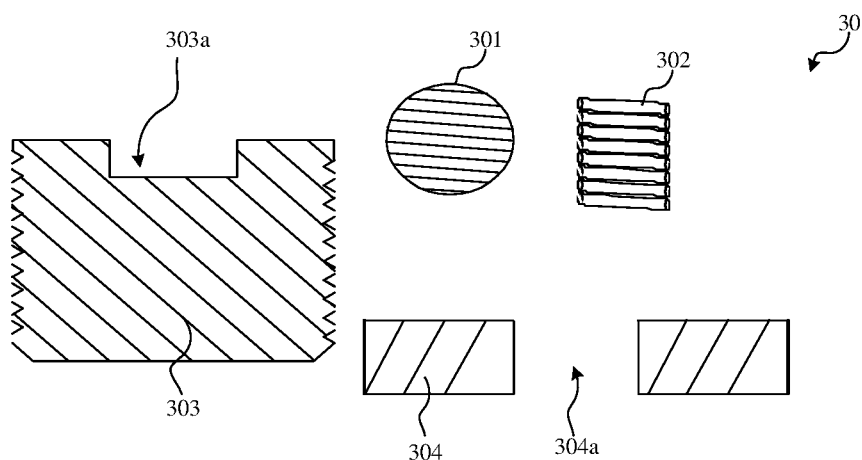
FIG. 4 is a first structural schematic diagram of a positioning assembly provided by an embodiment of the present application.

Please refer to FIG. 4, FIG. 4 is a first structure schematic diagram of a positioning assembly provided by an embodiment of the present application. The positioning assembly 30 further includes a fixing member 303. The fixing member 303 is defined with an accommodating cavity 303*a*. The elastic member 302 is disposed in the accommodating cavity 303*a*. The positioning member 301 is disposed on a side of the elastic member 302 away from a bottom of the accommodating cavity 303*a*. In this application, the elastic member 302 is disposed in the accommodating cavity 303*a* of the fixing member 303, so that the elastic member 302 is compressed or stretched in the accommodating cavity 303*a*, so as to ensure that the elastic member 302 will not be displaced.

It should be understood that, when the elastic member 302 moves along a side close to the bottom of the accommodating cavity 303*a*, the elastic member 302 is in a compressed state. The compressed state refers to a state that the elastic member 302 has under the effect of an external force, and in this state, the elastic member 302 has two opposing forces. When the elastic member 302 moves along a side away from the bottom of the accommodating cavity 303*a*, the elastic member 302 is in a stretched state. The stretched state refers to a state that the elastic member 302 has under the effect of an external force, and in this state, the elastic member 302 has two contrary forces.

It should be noted that the elastic member 302 provided in this embodiment of the present application may be one of a spring or a compression spring.

It should be noted that in some embodiments, the elastic member 302 is in contact with or connected to the positioning member 301.

In some embodiments, the positioning assembly 30 further includes a limiting member 304. The limiting member 304 is disposed on a side of the fixing member 303 away from the bottom of the accommodating cavity 303*a*. The limiting member 304 is defined with an opening 304*a*. The opening 304*a* communicates with the accommodating cavity 303*a*. And a width of the accommodating cavity 303*a* is greater than a width of the opening. In the embodiment of the present application, by disposing the limiting member 304 on the side of the fixing member 303 away from the bottom of the accommodating cavity 303*a*, the positioning member 301 is prevented from coming out of the accommodating cavity 303*a*.

It should be noted that in some embodiments, the opening 304*a* may be an elongated opening or a circular opening.

In some embodiments, a side wall of the limiting member 304 is located outside the fixing member 303, that is, the limiting member 304 has a suspended portion, and this design is convenient for grabbing the positioning assembly 30 into the first locking hole 1011*a*.

The first locking hole 1011*a* includes a first contact hole 1011*a*1 that is communicated to a second contact hole 1011*a*2. A hole wall of the second contact hole 1011*a*2 is located outside the first contact hole 1011*a*1. The fixing member 303 is disposed in the first contact hole 1011*a*1. The limiting member 304 is disposed in the second contact hole 1011*a*2. In the present application, the first locking hole 1011*a* is configured as a countersunk hole structure to fix the positioning component 30 in the first locking hole 1011*a*.

In some embodiments, the fixing member 303 is provided with external threads. The first contact hole 1011*a*1 is provided with internal threads corresponding to the external threads. The fixing member 303 is screw connected with the first contact hole 1011*a*1. A connection between the positioning assembly 30 and the first locking hole 1011*a* can be made more stable by adopting a screw connection.

In some embodiments, the first positioning hole 2011*a* is an arc-shaped hole. A shape of the positioning member 301 is a sphere, and a curvature radius of the first positioning hole 2011*a* and a radius of the positioning member 301 are same. In the present application, when the first display module 10 and the second display module 20 are spliced together, under the elastic effect of the elastic member 302, a part of the positioning member 301 is clamped into the first positioning hole 2011*a*. Since the curvature radius of the first positioning hole 2011*a* and the radius of the positioning member 301 are same, the positioning member 301 will not pop out from the first positioning hole 2011*a*.

In some embodiments, the positioning member 301 may be a steel ball.

In some embodiments, a diameter of the positioning member 301 is less than the width of the accommodating cavity 303*a*. And the diameter of the positioning member 301 is equal to the width of the opening 304*a*. Since the diameter of the positioning member is less than the diameter of the accommodating cavity 303*a*, it is convenient that after the positioning member 301 is ejected under the elastic effect of the elastic member 302, a part of the positioning member 301 is clamped into the limiting member 304 to complete precise alignment and splicing.

Figure 5:
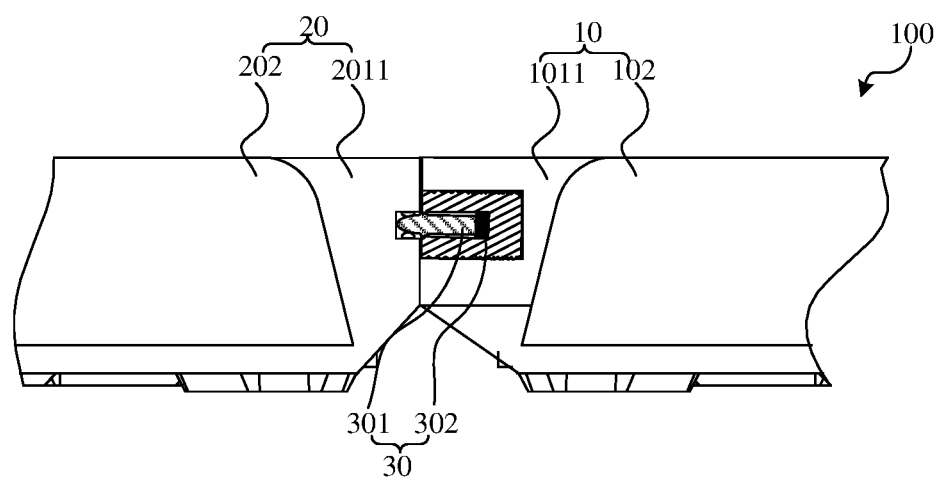
FIG. 5 is a second structural schematic diagram of the splicing display screen provided by an embodiment of the present application.
Figure 6:
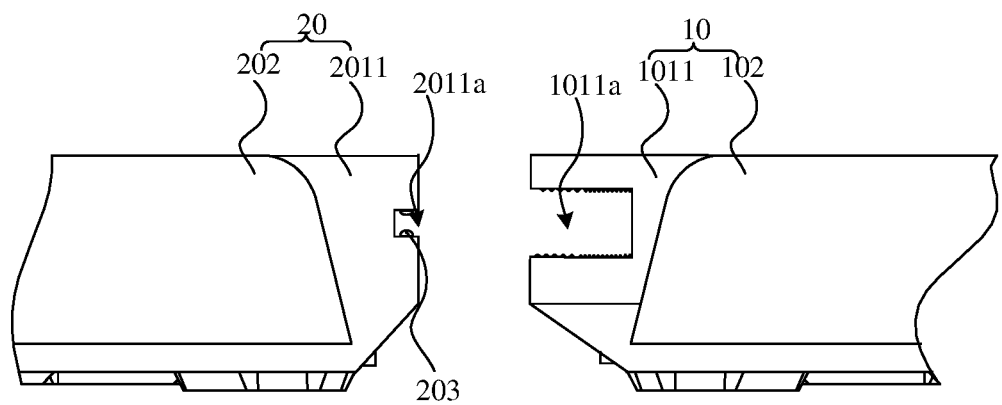
FIG. 6 is a second structural schematic diagram of the first display module and the second display module provided by an embodiment of the present application.
Figure 7:
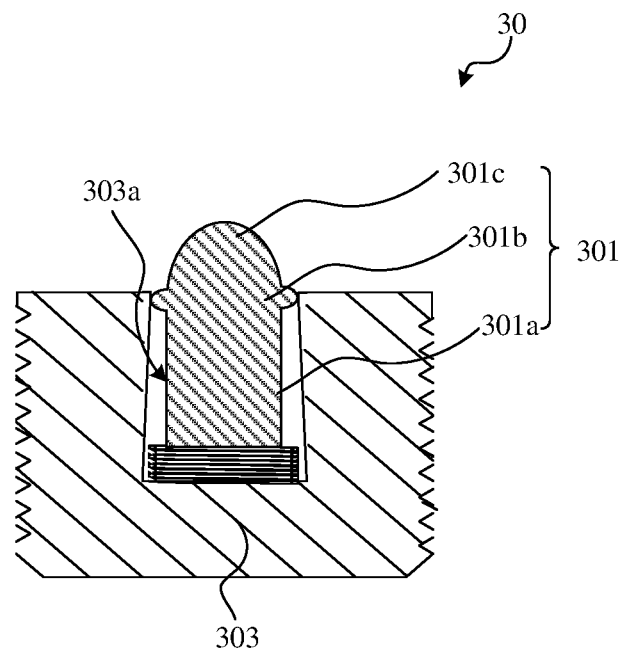
FIG. 7 is a second structural schematic diagram of the positioning assembly provided by an embodiment of the present application.

Please refer to FIG. 5, FIG. 6 and FIG. 7, FIG. 5 is a second structure schematic diagram of the splicing display screen provided by an embodiment of the present application. FIG. 6 is a second structure schematic diagram of the first display module and the second display module provided by an embodiment of the present application. FIG. 7 is a second structure schematic diagram the positioning assembly provided by an embodiment of the present application. A difference between the splicing display screen 100 provided by the embodiment of the present application and the splicing display screen 100 provided in FIG. 1 is that the positioning member 301 includes a first part 301*a*, a second part 301*b*, and a third part 301*c*. The first part 301*a* and the third part 301*c* are connected by the second part 301*b*, and a width of the second part 301*b* is equal to a width of a cavity opening of the accommodating cavity 303*a*. A shape of the third part 301*c* is a partial arc surface of a sphere. Convex points 203 are provided in the first positioning hole 2011*a*. After the positioning member 301 is clamped into the first positioning hole 2011*a*, the convex points 203 block an outward movement of the second portion 301*b*. In the embodiment of the present application, since the width of the second part 301*b* of the positioning member 301 is set to be same as the width of the cavity opening of the accommodating cavity 303*a*, and the convex points 203 are disposed in the first positioning hole 2011*a*, when the first display module 10 and the second display module 20 are spliced together, under the elastic effect of the elastic member 302, a part of the positioning member 301 is clamped into the first positioning hole 2011*a*, and the convex points 203 block the second part 301*b* from moving outward. Therefore, the splicing display screen 100 provided by the embodiment of the present application can not only realize precise positioning, but also can realize rapid splicing, and reduce a seam of the splicing display screen.

In some embodiments, the second part 301*b* includes a body portion and a plurality of protrusions surrounding an outer wall of the body portion, so as to clamp the positioning member 301 in the accommodating cavity 303*a*, and structures of the plurality of protrusions increase a frictional force with the accommodating cavity 303*a*, preventing the positioning member 301 from coming out of the accommodating cavity 303*a*.

Figure 8:
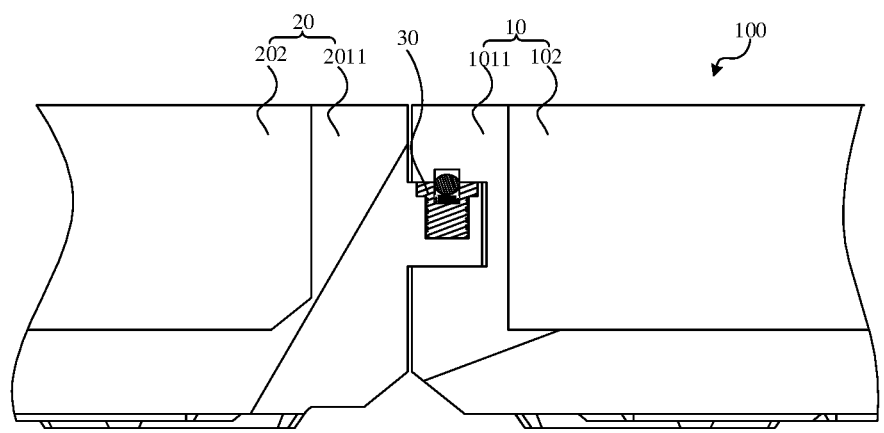
FIG. 8 is a third structural schematic diagram of the splicing display screen provided by an embodiment of the present application.
Figure 9:
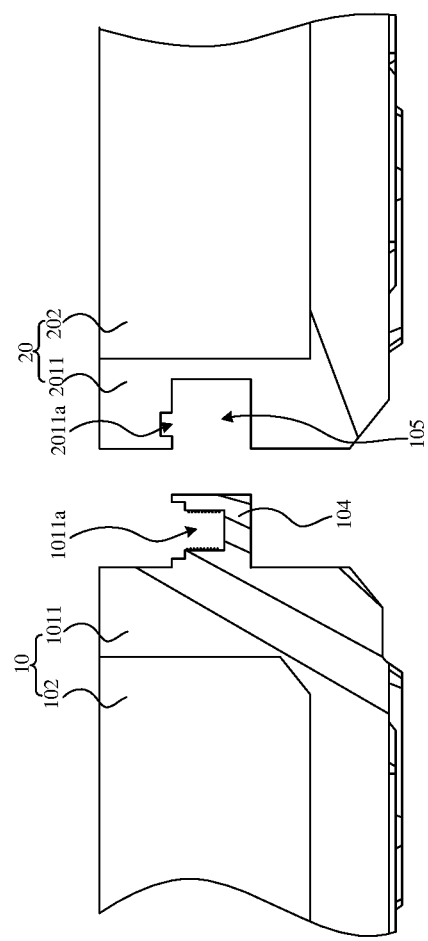
FIG. 9 is a third structural schematic diagram of the first display module and the second display module provided by an embodiment of the present application.

Please refer to FIG. 8 and FIG. 9, FIG. 8 is a third structural schematic diagram of the splicing display screen provided by an embodiment of the present application. FIG. 9 is a third structural schematic diagram the first display module and the second display module provided by an embodiment of the present application. A difference between the splicing display screen 100 provided by the embodiment of the present application and the splicing display screen 100 provided in FIG. 1 is that the first frame 1011 is further provided with bumps 104. The first locking hole 1011*a* is disposed at a side of the bump 104 close to a display surface of the first display module 10. The second frame 2011 is further defined with a groove 105. The first positioning hole 2011*a* is disposed at a side of the groove 105 close to a display surface of the second display module 20. The first positioning hole 2011*a* is communicated with the groove 105. The bump-104 is disposed in the groove 105. In the embodiment of the present application, by disposing the first locking hole 1011*a* on the bump 104 and disposing the groove 105 on an opposite side of the bump 104, when the first display module 10 and the second display module 20 are spliced together, the bump 104 and the groove 105 are used for positioning. During a positioning process, under the elastic effect of the elastic member 302, a part of the positioning member 301 is clamped into the first positioning hole 2011*a*, thereby completing the splicing of the first display module 10 and the second display module 20. The splicing display screen 100 provided by the embodiment of the present application can be precisely aligned, preventing the phenomena of the large gap between adjacent display modules after splicing of display modules, weak splicing, and uneven front and rear dislocation being prone to occur at the splicing line.

In summary, although the present application has been disclosed in preferred embodiments as above, the above-mentioned preferred embodiments are not intended to limit the present application. Those of ordinary skill in the art can make various modifications without departing from the spirit and scope of the present application. Therefore, the protection scope of the present application is subject to the scope defined by the claims.

What is claimed is:

1. A splicing display screen, comprising:
   at least one first display module, the first display module comprising a first frame, and the first frame defined with at least one first locking hole;
   at least one second display module, the second display module located on a side of the first display module, the second display module comprising a second frame, the second frame defined with at least one first positioning hole, one of the first positioning holes corresponding to one of the first locking holes;
   a positioning assembly, the positioning assembly disposed in the first locking hole, the positioning assembly comprising a positioning member and an elastic member, the positioning member being in contact with or connected to the elastic member, and the positioning member disposed on a side of the elastic member close to the first positioning hole, and a part of the positioning member clamped into the first positioning hole;
wherein the positioning assembly further comprises a fixing member, the fixing member is defined with an accommodating cavity, the elastic member is disposed in the accommodating cavity, and the positioning member is disposed on a side of the elastic member away from a bottom of the accommodating cavity;
wherein the positioning assembly further comprises a limiting member, the limiting member is disposed on a side of the fixing member away from the bottom of the accommodating cavity, and the limiting member is defined with an opening, the opening communicates with the accommodating cavity, and a width of the accommodating cavity is greater than a width of the opening.

2. The splicing display screen according to claim 1, wherein the first locking hole comprises a first contact hole and a second contact hole communicatingly disposed, and a hole wall of the second contact hole is located on an outer side of the first contact hole, the fixing member is disposed in the first contact hole, and the limiting member is disposed in the second contact hole.

3. The splicing display screen according to claim 2, wherein the fixing member is provided with external threads, the first contact hole is provided with internal threads corresponding to the external threads, and the fixing member is screw connected with the first contact hole.

4. The splicing display screen according to claim 1, wherein the first positioning hole is an arc-shaped hole, the positioning member is in a shape of a sphere, and a curvature radius of the first positioning hole and a radius of the positioning member are same.

5. The splicing display screen according to claim 4, wherein a diameter of the positioning member is less than the width of the accommodating cavity, and the diameter of the positioning member is equal to the width of the opening.

6. The splicing display screen according to claim 4, wherein the positioning member is a steel ball.

7. The splicing display screen according to claim 1, wherein the opening comprises an elongated opening or a circular opening.

8. The splicing display screen according to claim 1, wherein the positioning member comprises a first part, a second part, and a third part, and the first part and the third part are connected by the second part, a width of the second part is equal to a width of a cavity opening of the accommodating cavity, and a shape of the third part is a partial arc surface of a sphere.

9. The splicing display screen according to claim 8, wherein convex points are provided in the first positioning hole, after the positioning member is clamped into the first positioning hole, the convex points block an outward movement of the second part.

10. The splicing display screen according to claim 9, wherein the second part comprises a body portion and a plurality of protrusions surrounding an outer wall of the body portion.

11. The splicing display screen according to claim 1, wherein the first display module further comprises a third frame, the third frame is located on an opposite side of the first frame, and the third frame is defined with at least one second positioning hole;
the second display module further comprises a fourth frame, the fourth frame is located on an opposite side of the second frame, the fourth frame is defined with at least one second locking hole, one of the second positioning holes corresponds to one of the second locking holes, the positioning assembly is disposed in the second locking hole, the positioning member is disposed on a side of the elastic member close to the second positioning hole, and a part of the positioning member is clamped into the second positioning hole.

12. The splicing display screen according to claim 11, wherein the first display module comprises a first box body and a first light-emitting unit, the first box body comprises the first frame, the third frame, and a first support plate, the first box body is defined with a first accommodating slot, and the first light-emitting unit is disposed in the first accommodating slot;
the second display module comprises a second box body and a second light-emitting unit, the second box body comprises the second frame, the fourth frame, and a second support plate, the second box is defined with a second accommodating slot, and the second light-emitting unit is disposed in the second accommodating slot.

13. The splicing display screen according to claim 12, wherein a surface of the first support plate away from the first light-emitting unit is provided with a first anti-collision protrusion; a surface of the second support plate away from the second light-emitting unit is provided with a second anti-collision protrusion.

14. The splicing display screen according to claim 1, wherein the first frame is further defined with at least one second positioning hole, and the second positioning hole is defined on a side of the first locking hole;
the second frame is further defined with at least one second locking hole, the second locking hole is defined on a side of the first positioning hole, and one of the second positioning holes corresponds to one of the second locking holes, the positioning assembly is also disposed in the second locking hole, the positioning member is disposed on a side of the elastic member close to the second positioning hole, and a part of the positioning member is clamped into the second positioning hole.

15. The splicing display screen according to claim 1, wherein the first frame is further provided with a bump, and the first locking hole is disposed at a side of the bump close to a display surface of the first display module;
the second frame is further defined with a groove, the first positioning hole is disposed at a side of the groove close to a display surface of the second display module, and the first positioning hole is communicated with the groove, the bump is disposed in the groove.

16. The splicing display screen according to claim 1, wherein the first display module and the second display module comprise any one of organic light-emitting diode display module, micro light-emitting diode display module, millimeter light-emitting diode display module, or liquid crystal display module.

17. The splicing display screen according to claim 1, wherein the elastic member comprises one of a spring or a compression spring.

18. The splicing display screen according to claim 1, wherein the first display module and the second display module have a same structure.

* * * * *